(12) United States Patent
Martynov et al.

(10) Patent No.: US 12,374,630 B2
(45) Date of Patent: Jul. 29, 2025

(54) STRESS-REDUCED SILICON PHOTONICS SEMICONDUCTOR WAFER

(71) Applicant: Newport Fab, LLC, Newport Beach, CA (US)

(72) Inventors: Oleg Martynov, Lebanon, NH (US); Edward Preisler, San Clemente, CA (US); William Krieger, Portland, OR (US)

(73) Assignee: Newport Fab, LLC, Newport Beach, CA (US)

( * ) Notice: Subject to any disclaimer, the term of this patent is extended or adjusted under 35 U.S.C. 154(b) by 654 days.

(21) Appl. No.: 17/741,849

(22) Filed: May 11, 2022

(65) Prior Publication Data

US 2023/0369242 A1    Nov. 16, 2023

(51) Int. Cl.
| | | |
|---|---|---|
| *G02B 6/12* | (2006.01) | |
| *H01L 23/00* | (2006.01) | |
| *H01L 23/29* | (2006.01) | |
| *H01L 23/31* | (2006.01) | |

(52) U.S. Cl.
CPC .............. *H01L 23/562* (2013.01); *G02B 6/12* (2013.01); *G02B 2006/12061* (2013.01); *H01L 23/298* (2013.01); *H01L 23/3171* (2013.01)

(58) Field of Classification Search
CPC . H01L 23/562; H01L 23/298; H01L 23/3171; G02B 6/12; G02B 2006/12061; G02B 6/122; G02B 6/136
See application file for complete search history.

(56) References Cited

U.S. PATENT DOCUMENTS

| | | | |
|---|---|---|---|
| 11,675,126 B1 * | 6/2023 | Kodigala | H01S 5/209 385/14 |
| 2005/0211664 A1 * | 9/2005 | Khan | G02B 6/122 216/37 |
| 2006/0234506 A1 * | 10/2006 | Tseng | B81C 1/00896 257/E21.279 |
| 2007/0072326 A1 * | 3/2007 | Zheng | H01L 31/02165 257/292 |
| 2013/0188918 A1 * | 7/2013 | Painchaud | G02B 6/03694 427/163.2 |
| 2016/0178861 A1 * | 6/2016 | Osenbach | G02B 6/4219 385/14 |
| 2022/0003927 A1 * | 1/2022 | Feshali | G01C 19/722 |
| 2023/0091428 A1 * | 3/2023 | Kim | G02B 6/4212 385/14 |

\* cited by examiner

*Primary Examiner* — S M Sohel Imtiaz
(74) *Attorney, Agent, or Firm* — Farjami & Farjami LLP (57) ABSTRACT

A stress-reduced silicon photonics semiconductor wafer includes a silicon nitride layer on a backside of the wafer. At least one silicon nitride stress-reduction configuration is on a topside of the wafer. At least one silicon nitride photonics device is also on the topside of the wafer. A silicon photonics device can be situated in the wafer.

20 Claims, 6 Drawing Sheets

STRESS-REDUCED SILICON PHOTONICS SEMICONDUCTOR WAFER

BACKGROUND

Silicon photonics semiconductor wafers including silicon photonics devices are commonly utilized in a variety of applications, such as in telecommunications devices as transceivers for optical signals. Integration of silicon nitride (SiN) photonics devices in silicon photonics semiconductor wafers can enhance optical performance characteristics. However, conventional formation of SiN photonics devices can introduce high stresses to a wafer, resulting in wafer warp, which can cause significant disadvantages.

Wafer warp can cause poor photolithography alignment resulting in degraded performance or device failure. Wafer warp can also make basic wafer handling problematic. For example, it can be difficult or impossible to secure a warped wafer using a vacuum chuck. As another example, handling equipment relying on a uniform wafer height could collide a warped wafer into other equipment or into other wafers, resulting in equipment damage or lower yield. Moreover, these issues are compounded for larger wafers, since wafer warp is generally greater for larger wafers.

Thus, there is a need in the art for silicon photonics semiconductor wafers that integrate SiN photonics devices with improved control over wafer stresses and warping.

SUMMARY

The present disclosure is directed to a stress-reduced silicon photonics semiconductor wafer including silicon nitride stress-reduction configurations, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
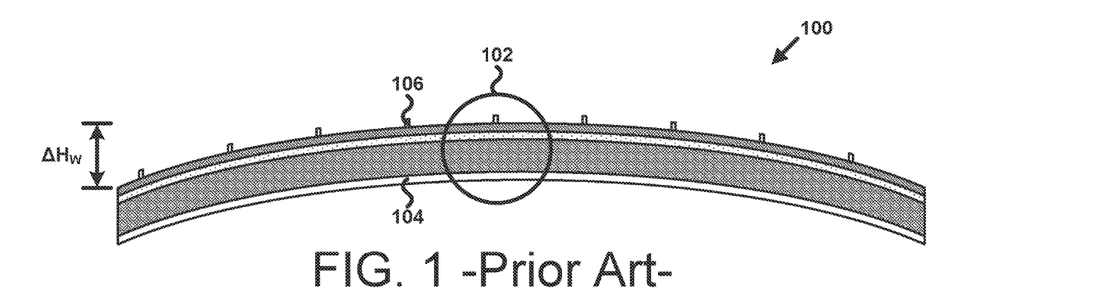
FIG. 1 illustrates an exemplary cross-sectional view of a conventional silicon photonics semiconductor wafer.

FIG. 1 illustrates an exemplary cross-sectional view of a conventional silicon photonics semiconductor wafer. Silicon photonics semiconductor wafer 100 represents a conventional semiconductor wafer including one or more silicon photonics devices configured to generate, detect, or manipulate light. In one implementation, silicon photonics semiconductor wafer 100 is a silicon-on-insulator (SOI) wafer.

As shown in FIG. 1, silicon nitride (SiN) layer 104 is situated on the backside of silicon photonics semiconductor wafer 100, and SiN photonics devices, including SiN photonics device 106, are situated on the topside of silicon photonics semiconductor wafer 100. In various implementations, silicon photonics semiconductor wafer 100 may include more or fewer SiN photonics devices than shown in FIG. 1.

Notably, SiN layer 104 in FIG. 1 extends continuously across the entire backside of silicon photonics semiconductor wafer 100. Meanwhile, the SiN photonics devices, including SiN photonics device 106, are relatively narrow and relatively sparse across the topside of silicon photonics semiconductor wafer 100. In other words, backside SiN layer 104 occupies significantly more area compared to the SiN photonics devices on the topside of the wafer. In the present implementation, SiN layer 104 and SiN photonics devices in FIG. 1 are formed of low-pressure chemical vapor deposition (LPCVD) SiN. LPCVD SiN is regularly used in photonics, however, it introduces high stresses to a wafer. Because SiN layer 104 occupies significantly more area on the backside of silicon photonics semiconductor wafer 100 compared to the SiN photonics devices on the topside of silicon photonics semiconductor wafer 100, silicon photonics semiconductor wafer 100 experiences a stress differential that warps silicon photonics semiconductor wafer 100.

As shown in FIG. 1, silicon photonics semiconductor wafer 100 experiences a wafer warp $\Delta H_W$. In the present implementation, wafer warp $\Delta H_W$ represents a height difference across silicon photonics semiconductor wafer 100. Wafer warp $\Delta H_W$ of silicon photonics semiconductor wafer 100 results in its ends being lower and its center being higher. Wafer warp $\Delta H_W$ is an indicator of the net stress of silicon photonics semiconductor wafer 100. Wafer warp $\Delta H_W$ may be measured, for example, by using a laser scanning technique. In various implementations, wafer warp $\Delta H_W$ may be approximately one hundred microns to two hundred microns (100-200 μm).

Wafer warp $\Delta H_W$ can result in several significant disadvantages. Since the topside of silicon photonics semiconductor wafer 100 is not straight, photolithography subsequently performed on silicon photonics semiconductor wafer 100 can experience poor alignment. As a corollary, devices that rely on this photolithography can fail or experience degraded performance. Basic wafer handling can also become problematic. For example, it can be difficult or impossible to secure silicon photonics semiconductor wafer 100 using a vacuum chuck. As another example, handling equipment relying on a uniform wafer height could collide silicon photonics semiconductor wafer 100 into other equipment or into other wafers, resulting in equipment damage or lower yield. Moreover, these issues are compounded for larger wafers, since wafer warp $\Delta H_W$ is generally greater for larger wafers. For example, where silicon photonics semiconductor wafer 100 has a diameter of eight inches (8 in), wafer warp $\Delta H_W$ may be approximately one hundred microns to two hundred microns (100-200 µm), meanwhile, when silicon photonics semiconductor wafer 100 has a diameter of twelve inches (12 in), wafer warp $\Delta H_W$ may be significantly greater two hundred microns (>>200 µm).

Figure 2:
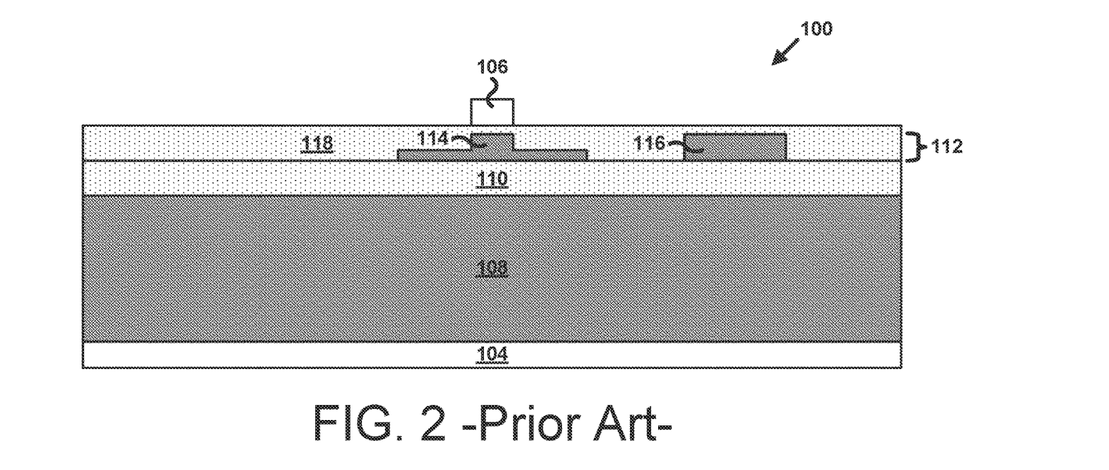
FIG. 2 illustrates an exemplary cross-sectional view of a portion of a conventional silicon photonics semiconductor wafer corresponding to the silicon photonics semiconductor wafer of FIG. 1.

FIG. 2 illustrates an exemplary cross-sectional view of a portion of a conventional silicon photonics semiconductor wafer corresponding to the silicon photonics semiconductor wafer of FIG. 1. That is, silicon photonics semiconductor wafer 100 in FIG. 2 generally corresponds to portion 102 of silicon photonics semiconductor wafer 100 in FIG. 1. As shown in FIG. 2, silicon photonics semiconductor wafer 100 includes SiN layer 104, SiN photonics device 106, handle wafer 108, buried oxide (BOX) 110, top silicon layer 112, silicon photonics devices 114 and 116, and oxide layer 118. In the present implementation, silicon photonics semiconductor wafer 100 is an SOI wafer, as known in the art. Silicon photonics devices 114 and 116 in top silicon layer 112 may be any silicon photonics devices known in the art, such as a waveguide, a photodetector, a laser, a modulator, and/or a grating coupler.

As described above, SiN layer 104 is situated on the backside of conventional silicon photonics semiconductor wafer 100, and SiN photonics device 106 is situated on the topside of conventional silicon photonics semiconductor wafer 100. In various implementations, SiN layer 104 and/or SiN photonics device 106 may have a thickness of approximately seventy-five nanometers to five hundred nanometers (75-500 nm) or greater or less. Like silicon photonics devices 114 and 116, SiN photonics device 106 device is configured to generate, detect, or manipulate light. Unlike silicon only photonics devices 114 and 116, SiN photonics device 106 is formed from SiN material. As described below, photonics devices formed from SiN material can provide certain advantages over photonics devices formed from silicon only material. However, SiN photonics devices are typically very long and narrow, resulting in wafer warp $\Delta H_W$, as described above.

In various implementations, the cross-sectional portion of SiN photonics device 106 visible in FIG. 2 may be a portion of a waveguide, an interferometer, a splitter/combiner, a resonator, or any other SiN photonics device known in the art. In the implementation of FIG. 2, SiN photonics device 106 is shown aligned with silicon photonics device 114, which may correspond to an optical transition region of silicon photonics semiconductor wafer 100. However, it is understood that SiN photonics device 106 need not be aligned with any of silicon photonics devices 114 or 116.

Figure 3:
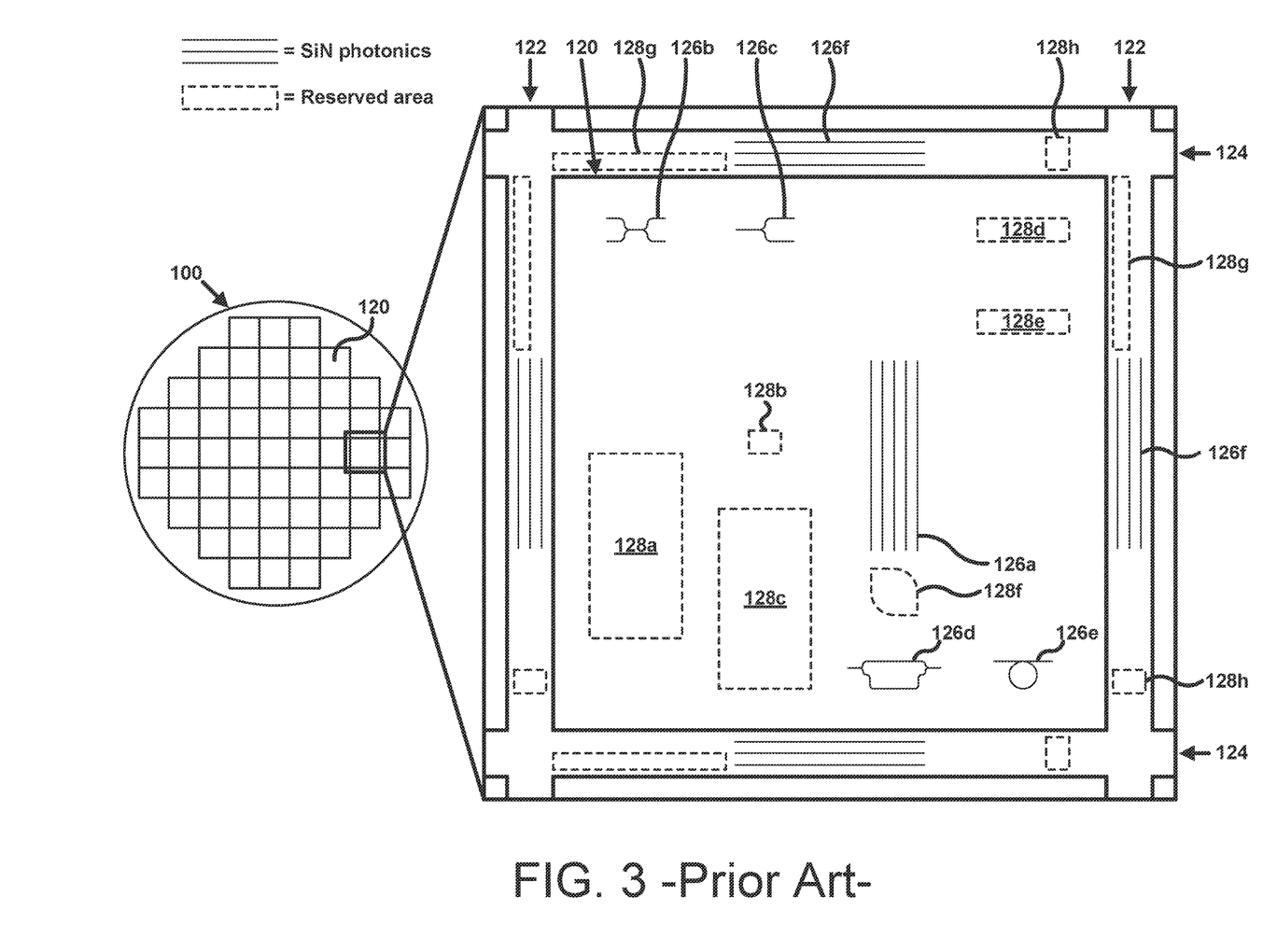
FIG. 3 illustrates an exemplary plan view of a conventional silicon photonics semiconductor wafer and an enlarged plan view of a portion of the silicon photonics semiconductor wafer.

FIG. 3 illustrates an exemplary plan view of a conventional silicon photonics semiconductor wafer and an enlarged plan view of a portion of the conventional silicon photonics semiconductor wafer. Conventional silicon photonics semiconductor wafer 100 in FIG. 3 generally corresponds to conventional silicon photonics semiconductor wafer 100 in FIGS. 1 and 2, and may have any implementations described above. As shown in FIG. 3, silicon photonics semiconductor wafer 100 includes multiple dies 120. As shown in the enlarged plan view, dies 120 are separated by scribe lines 122 and 124. Scribe lines 122 are transverse to scribe lines 124. Dies 120 represent spaces where functional devices can be situated. Scribe lines 122 and 124 represent spaces where silicon photonics semiconductor wafer 100 can be diced without damaging functional devices situated in dies 120. In one implementation, each of scribe lines 122 and 124 has a width of approximately one hundred microns (100 µm).

In various implementations, silicon photonics semiconductor wafer 100 can include greater or fewer dies 120 than those shown in FIG. 3. In the present implementation, scribe lines scribe lines 122 and 124 form a grid pattern and dies 120 have an approximately square shape. In various implementations, scribe lines 122 and 124 and dies 120 may have any other shapes and/or arrangements in silicon photonics semiconductor wafer 100.

The enlarged plan view in FIG. 3 shows the topside of silicon photonics semiconductor wafer 100. As shown, several SiN photonics devices 126a, 126b, 126c, 126d, 126e, and 126f, collectively referred to herein as SiN photonics devices 126, are situated on the topside of silicon photonics semiconductor wafer 100. SiN photonics devices 126 in FIG. 3 generally corresponds to SiN photonics devices 106 in FIGS. 1 and 2, and may have any implementations described above.

SiN photonics devices 126a, 126b, 126c, 126d, and 126e are situated in die 120. In the present implementation, SiN photonics devices 126a, 126b, 126c, 126d, and 126e are illustrated as a waveguide array, a coupler, a splitter/combiner, an interferometer, and a resonator, respectively. SiN photonics device 126e may be optical ring resonator used as a filter, a modulator, or any other similar device known in the art. In various implementations, SiN photonics devices 126a, 126b, 126c, 126d, and 126e may be any other SiN photonics devices known in the art. SiN photonics devices 126a, 126b, 126c, 126d, and 126e may be utilized to manipulate light throughout die 120. For example, where SiN photonics device 126a is a waveguide array. SiN photonics device 126a may carry optical signals from one part of die 120 to another part of die 120. Also, any of SiN photonics devices 126 may be situated over an optical transition region, as described above, and may be optically coupled to underlying silicon photonics devices.

SiN photonics devices 126f are situated in scribe lines 122 and 124. In the present implementation. SiN photonics devices 126f are illustrated as waveguide arrays. In various implementations, SiN photonics devices 126f may be any other SiN photonics devices known in the art. SiN photonics devices 126f in scribe lines 122 and 124 may be utilized for process control of photonics devices in silicon photonics semiconductor wafer 100. In various implementations, silicon photonics semiconductor wafer 100 may include greater or fewer SiN photonics devices 126, of the same or different types, than those shown in FIG. 3

As described above, SiN photonics devices 126 can provide certain advantages over silicon only photonics devices. Although SiN photonics devices 126 cannot be enhanced by implants like silicon photonic devices, SiN photonics devices 126 can provide a different index of refraction that is more advantageous for a given application. Additionally, SiN photonics devices 126 can provide lower optical propagation losses, especially at typical telecommunications wavelengths, such as wavelengths of 1310 nm or 1550 nm, and at visible wavelengths, such as 400 nm to 700 nm.

However, as shown in FIG. 3, SiN photonics devices 126 are relatively narrow and relatively sparse across the topside of conventional silicon photonics semiconductor wafer 100. As a result, large portions of the surface area of the topside of silicon photonics semiconductor wafer 100 are not occupied by SiN material as compared with the uniform and continuous block of SiN layer 104 that occupies all or almost all of the backside surface of the semiconductor wafer, causing silicon photonics semiconductor wafer 100 to experience a stress differential and wafer warp $\Delta H_W$, as described above. For example, in one implementation, SiN photonics devices 126 occupy less than half of the surface area of the topside of silicon photonics semiconductor wafer 100.

As shown in FIG. 3, the topside of silicon photonics semiconductor wafer 100 also has several reserved areas 128a, 128b, 128c, 128d, 128e. 128f, 128g, and 128h, collectively referred to herein as reserved areas 128. Reserved areas 128 represent regions of silicon photonics semiconductor wafer 100 where SiN photonics devices 126 should not be situated. For example, reserved areas 128 may be areas reserved for making electrical contact between underlying and overlying layers, or may be areas reserved for external optical couplings of die 120. However, even after accounting for reserved areas 128, large portions of the surface area of the topside of silicon photonics semiconductor wafer 100 are still not occupied by SiN material.

Figure 4:
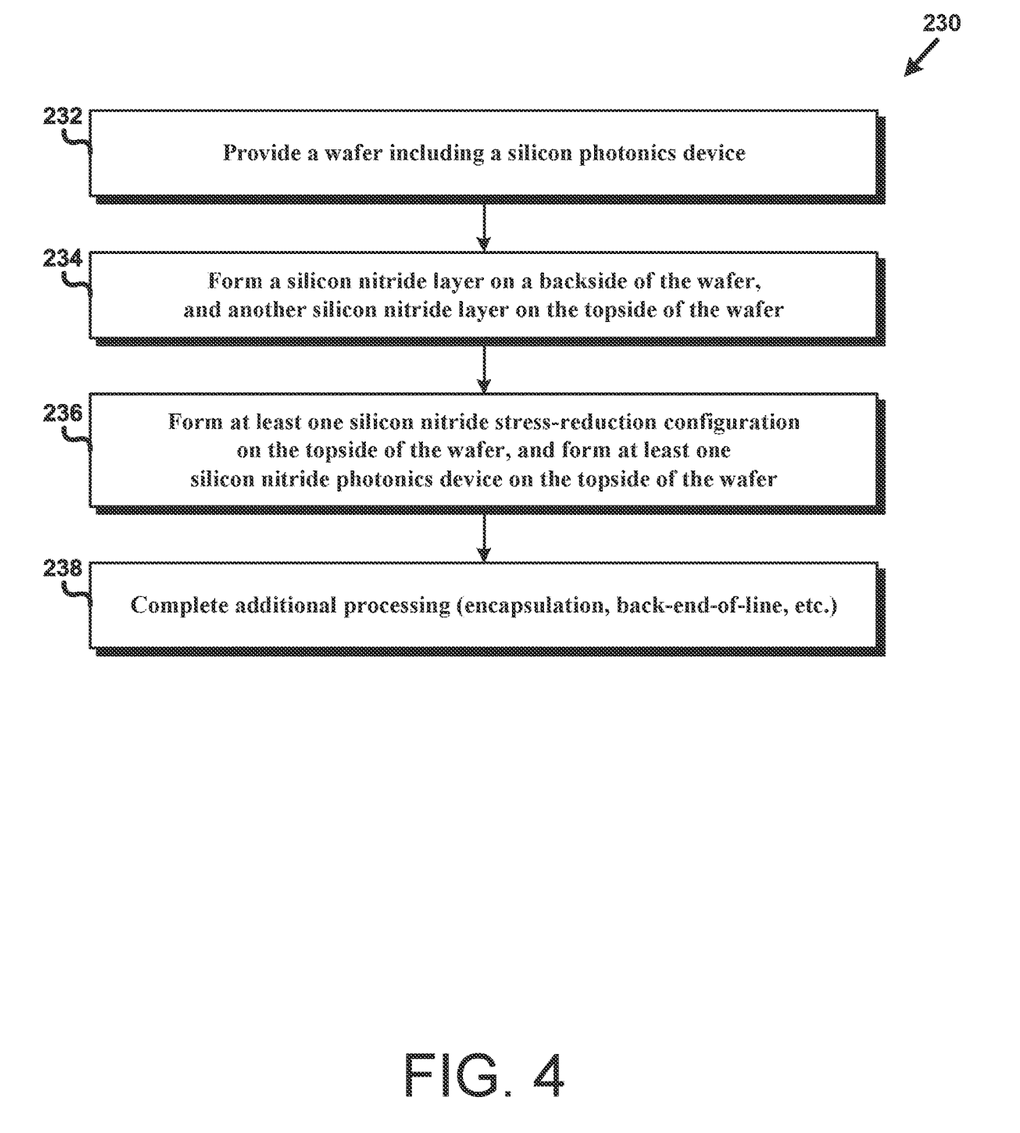
FIG. 4 illustrates a flowchart of an exemplary method for making a stress-reduced silicon photonics semiconductor wafer according to one implementation of the present application.
Figure 5:
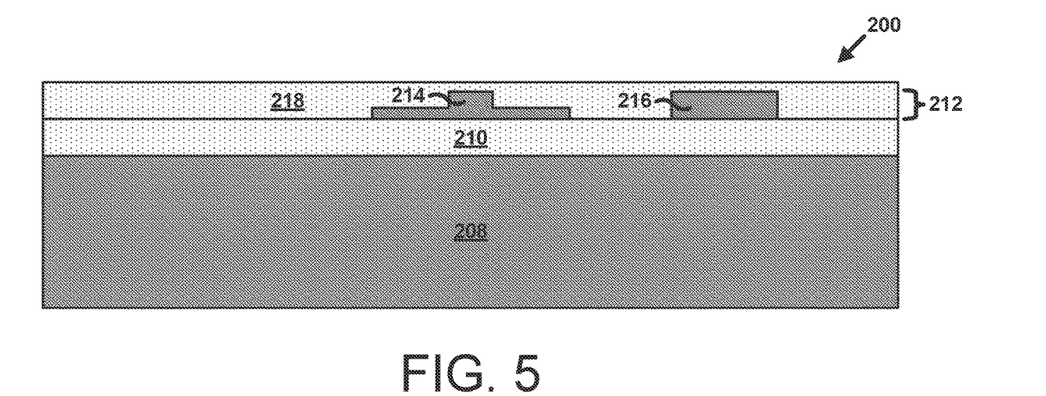
FIG. 5 illustrates an exemplary cross-sectional view of a portion of a silicon photonics semiconductor wafer processed in accordance with the flowchart of FIG. 4 according to one implementation of the present application.
Figure 6:
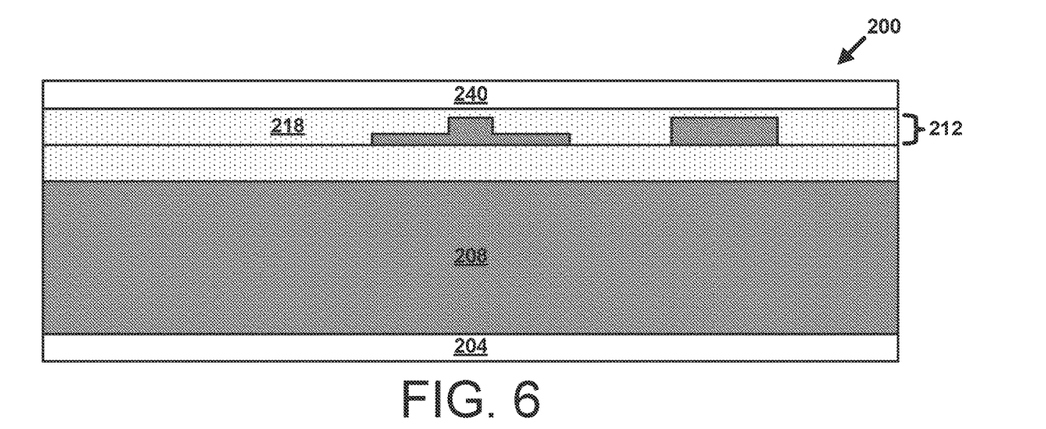
FIG. 6 illustrates an exemplary cross-sectional view of a portion of a silicon photonics semiconductor wafer processed in accordance with the flowchart of FIG. 4 according to one implementation of the present application.

FIG. 4 illustrates a flowchart of an exemplary method for making a stress-reduced silicon photonics semiconductor wafer according to one implementation of the present application. Structures shown in FIGS. 5 through 9 illustrate the results of performing actions 232 through 236 shown in flowchart 230 of FIG. 4. In particular, FIG. 5 shows a silicon photonics semiconductor wafer after performing action 232 in FIG. 4, FIG. 6 shows a silicon photonics semiconductor wafer after performing action 234 in FIG. 4, and FIGS. 7 through 9 show a stress-reduced silicon photonics semiconductor wafer after performing action 236 in FIG. 4.

Actions 232 through 238 shown in flowchart 230 of FIG. 4 are sufficient to describe one implementation of the present inventive concepts. Other implementations of the present inventive concepts may utilize actions different from those shown in the flowchart of FIG. 4. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 5 illustrates an exemplary cross-sectional view of a portion of a silicon photonics semiconductor wafer processed in accordance with action 232 in the flowchart of FIG. 4 according to one implementation of the present application. As shown in FIG. 5, silicon photonics semiconductor wafer 200, including silicon photonics devices 214 and 216, is provided. In the present implementation, silicon photonics semiconductor wafer 200 is an SOI wafer including handle wafer 208, BOX 210, top silicon layer 212. Silicon photonics semiconductor wafer 200 also includes oxide layer 218 over top silicon layer 212. Handle wafer 208, BOX 210, top silicon layer 212, silicon photonics devices 214 and 216, and oxide layer 218 in FIG. 5 generally correspond to handle wafer 108, BOX 110, top silicon layer 112, silicon photonics devices 114 and 116, and oxide layer 118 in FIG. 2, respectively, and may have any implementations described above.

In providing silicon photonics semiconductor wafer 200 in FIG. 5, a bonded and etch back SOI (BESOI) process can be used, as known in the art. In a BESOI process, handle wafer 208, BOX 210, and top silicon layer 212 together form an SOI wafer. Alternatively, as also known in the art, a SIMOX process (separation by implantation of oxygen process) or a "smart cut" process can also be used for providing silicon photonics semiconductor wafer 200. In a SIMOX process, handle wafer 208 can be a bulk silicon support wafer (which for ease of reference, may still be referred to as a "handle wafer" in the present application). Similar to a BESOI process, in both SIMOX and smart cut processes, handle wafer 208, BOX 210, and top silicon layer 212 together form an SOI substrate.

In one implementation, handle wafer 208 is undoped silicon. In various implementations, handle wafer 208 has a thickness of approximately seven hundred microns (700 μm) or greater or less. In one implementation, a trap rich layer (not shown in FIG. 5) can be situated between handle wafer 208 and BOX 210. In various implementations, BOX 210 typically comprises silicon dioxide ($SiO_2$), but it may also comprise SiN, or another insulator material. In various implementations. BOX 210 has a thickness of approximately one micron (1 μm) or greater or less. In one implementation, top silicon layer 212 includes doped silicon. In various implementations, top silicon layer 212 has a thickness of approximately three hundred nanometers (300 nm) or greater or less. Handle wafer 208, BOX 210, and top silicon layer 212 can be provided together in silicon photonics semiconductor wafer 200 as a pre-fabricated SOI wafer.

Silicon photonics semiconductor wafer 200 includes silicon photonics devices 214 and 216. Silicon photonics devices 214 and 216 may be any silicon photonics devices known in the art, such as a waveguide, a photodetector, a laser, a modulator, and/or a grating coupler. Silicon photonics devices 214 and 216 are formed in top silicon layer 212. In silicon photonics semiconductor wafer 200, part of top silicon layer 212 is removed to isolate silicon photonics devices 214 and 216. In other implementations, dedicated isolation structures can be used. In various implementations, silicon electrical devices (not shown in FIG. 5) may be integrated in top silicon layer 212. Such devices may be any silicon electrical devices known in the art, such as a transistor, an operational amplifier, a driver, a filter, a mixer, or a diode.

Oxide layer 218 is situated over silicon photonics devices 214 and 216 in silicon photonics semiconductor wafer 200. In various implementations, oxide layer 218 may comprise silicon oxide ($SiO_2$), silicon onynitride ($Si_xO_yN_z$), or another dielectric. In various implementations, the height of oxide layer 218 above silicon photonics devices 214 and 216 may be approximately one hundred nanometers (100 nm).

FIG. 6 illustrates an exemplary cross-sectional view of a portion of a silicon photonics semiconductor wafer processed in accordance with action 234 in the flowchart of FIG. 4 according to one implementation of the present application. As shown in FIG. 6, SiN layer 204 is formed on a backside of silicon photonics semiconductor wafer 200, and SiN layer 240 is formed on a topside of silicon photonics semiconductor wafer 200. SiN layer 204 is situated under handle wafer 208 and SiN layer 240 is situated over top silicon layer 212 and oxide layer 218. SiN layer 204 in FIG. 6 generally correspond to SiN layer 104 in FIG. 2 and may have any implementations described above.

In the present implementation, SiN layers 204 and 240 are formed substantially concurrently. For example, silicon photonics semiconductor wafer 200, along with other wafers, may be placed into a furnace standing up with both the backside and the topside exposed to gases and plasma used for deposition. Then, an LPCVD SiN deposition may be performed in order to form SiN layer 204 on the backside of silicon photonics semiconductor wafer 200, and SiN layer 240 on the topside of silicon photonics semiconductor wafer 200. The SiN deposition may employ low pressure and high temperature, such as a temperature of approximately eight hundred degrees Celsius to nine hundred degrees Celsius (800-900° C.), and a mixture of silane and nitrogen.

In the present implementation, SiN layers 204 and 240 have approximately the same thickness since they are formed substantially concurrently. In various implementations, SiN layers 204 and 240 may both have a thickness of approximately seventy-five nanometers to five hundred nanometers (75-500 nm). In various implementations, SiN layers 204 and 240 may be formed separately and may have different thicknesses from each other.

Notably, in FIG. 6, SiN layer 204 extends continuously across the entire backside of silicon photonics semiconductor wafer 200, and SiN layer 240 similarly extends continuously across the entire topside of silicon photonics semiconductor wafer 200. At this step, SiN layers 204 and 240 have little or no stress differential and contribute little or nothing to the net stress of silicon photonics semiconductor wafer 200. At this step, the net stress of silicon photonics semiconductor wafer 200 is generally governed by the layers between SiN layers 204 and 240.

Figure 7:
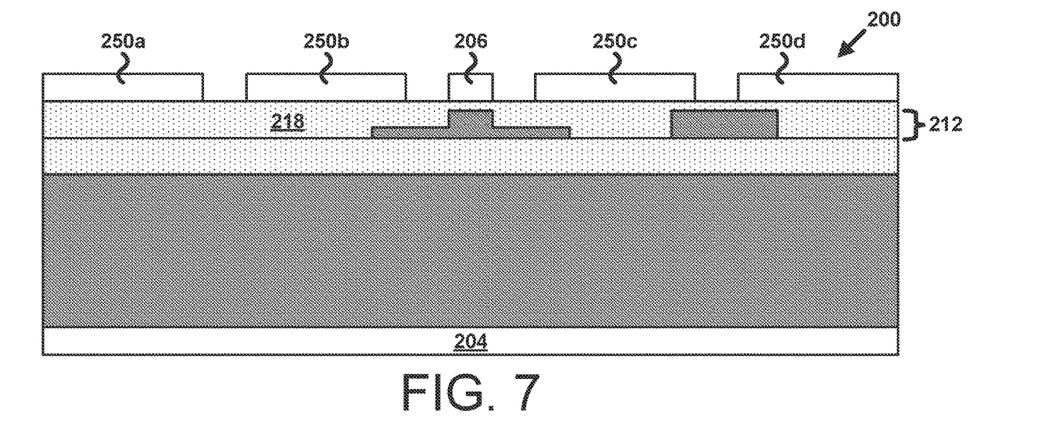
FIG. 7 illustrates an exemplary cross-sectional view of a portion of a stress-reduced silicon photonics semiconductor wafer processed in accordance with the flowchart of FIG. 4 according to one implementation of the present application.

FIG. 7 illustrates an exemplary cross-sectional view of a portion of a stress-reduced silicon photonics semiconductor wafer processed in accordance with action 236 in the flowchart of FIG. 4 according to one implementation of the present application. As shown in FIG. 7, SiN stress-reduction configurations 250a, 250b, 250c, and 250d, collectively referred to herein as SiN stress-reduction configurations 250, are formed on the topside of stress-reduced silicon photonics semiconductor wafer 200. As also shown in FIG. 7, SiN photonics device 206 is formed on the topside of stress-reduced silicon photonics semiconductor wafer 200.

SiN photonics device 206 is situated over top silicon layer 212 and oxide layer 218. In various implementations, SiN photonics device 206 in FIG. 7 may be a waveguide, an interferometer, a splitter/combiner, a resonator, or any other SiN photonics device known in the art. SiN photonics device 206 in FIG. 7 generally corresponds to SiN photonics device 106 in FIG. 2 and may have any implementations described above. In various implementations, stress-reduced silicon photonics semiconductor wafer 200 may include more or fewer SiN photonics devices than shown in FIG. 7.

SiN stress-reduction configurations 250 are situated over top silicon layer 212 and oxide layer 218. SiN stress-reduction configurations 250 are designed to manipulate the net stress of stress-reduced silicon photonics semiconductor wafer 200. In particular, SiN stress-reduction configurations 250 are relatively wide compared to SiN photonics device 206, and large portions of the surface area of the topside of stress-reduced silicon photonics semiconductor wafer 200 are occupied by SiN material. As a result, SiN stress-reduction configurations 250 on the topside of stress-reduced silicon photonics semiconductor 200 introduce high stresses that largely counteract the high stress introduced by SiN layer 204 on the backside of stress-reduced silicon photonics semiconductor 200, which would otherwise dominate the net stress of stress-reduced silicon photonics semiconductor 200. In other words, SiN layer 204 and SiN stress-reduction configurations 250 have little stress differential. Accordingly, stress-reduced silicon photonics semiconductor 200 may experience little to no wafer warp $\Delta H_W$.

In one implementation, SiN stress-reduction configurations 250 and SiN photonics device 206 may be formed substantially concurrently. For example, a single mask may be formed over SiN layer 240 in FIG. 6, then a dry plasma etch may be performed in order to form SiN stress-reduction configurations 250 and SiN photonics device 206. The dry plasma etch may be selective to nitride and stop at oxide layer 218.

Although SiN stress-reduction configurations 250 may be formed substantially concurrently with SiN photonics device 206, SiN stress-reduction configurations 250 are not active photonics devices and are not designed to manipulate light on the topside of stress-reduced silicon photonics semiconductor 200. The dimensions and locations of SiN stress-reduction configurations 250 may be chosen so as not to interfere with active photonics devices of stress-reduced silicon photonics semiconductor 200, such as SiN photonics device 206.

It is noted that the illustrations in FIG. 7 are generally not to scale, and are not intended to correspond to actual relative dimensions. For example, SiN stress-reduction configurations 250 may be significantly wider, or spaced further from SiN photonics device 206, than shown in FIG. 7. In various implementations, SiN stress-reduction configurations 250 and SiN photonics device 206 may be formed separately. In various implementations, stress-reduced silicon photonics semiconductor wafer 200 may include more or fewer SiN stress-reduction configurations 250 than shown in FIG. 7.

Figure 8:
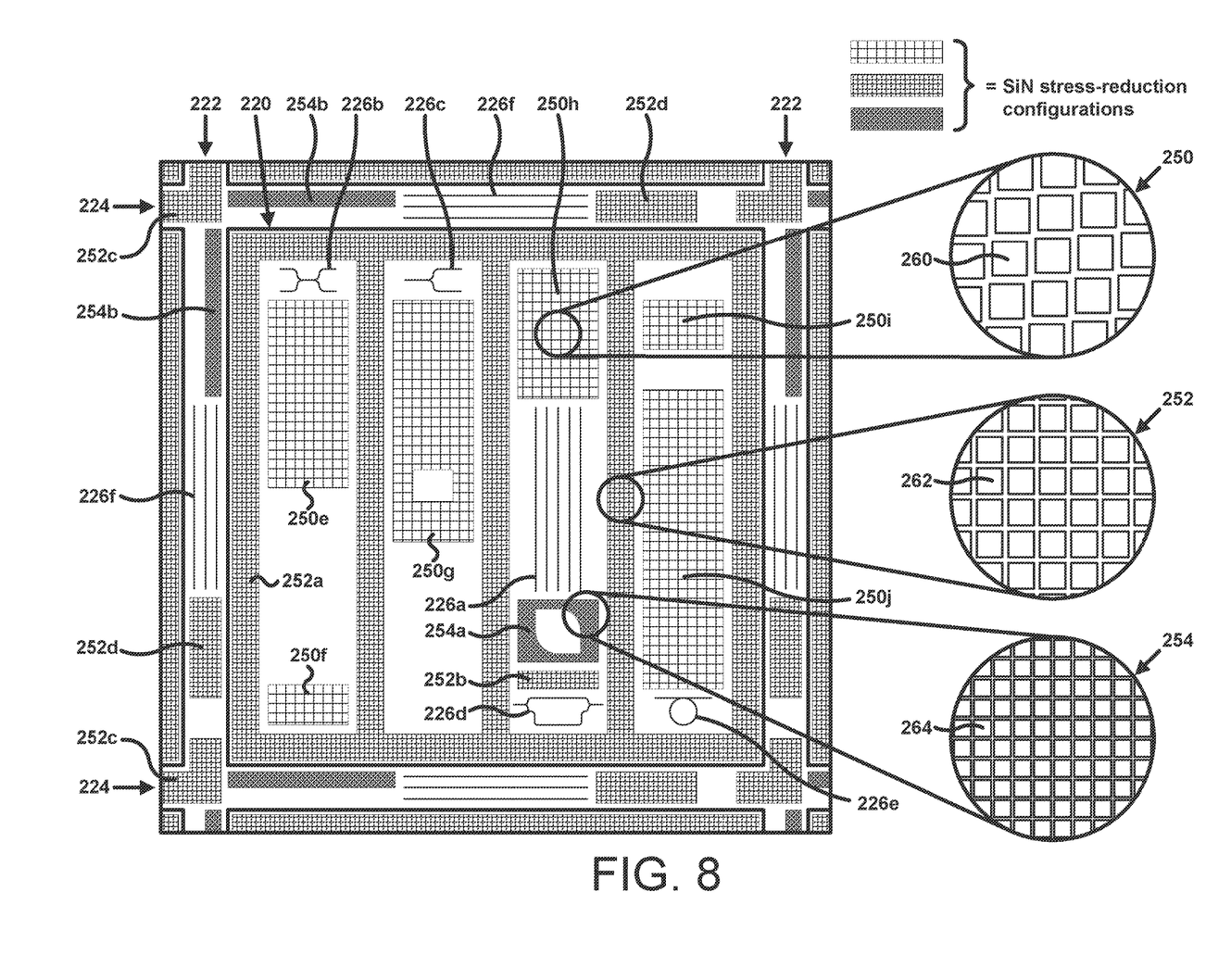
FIG. 8 illustrates an exemplary plan view of a portion of a stress-reduced silicon photonics semiconductor wafer processed in accordance with the flowchart of FIG. 4 and enlarged plan views of silicon nitride stress-reduction configurations according to one implementation of the present application.

FIG. 8 illustrates an exemplary plan view of a portion of a stress-reduced silicon photonics semiconductor wafer processed in accordance with action 236 in the flowchart of FIG. 4 and enlarged plan views of silicon nitride stress-reduction configurations according to one implementation of the present application. Except for differences noted below, the stress-reduced silicon photonics semiconductor wafer portion in FIG. 8 generally represents an exemplary die layout corresponding to stress-reduced silicon photonics semiconductor wafer 200 in FIG. 7, and may have any implementations and advantages described above.

As shown in FIG. 8, die 220 is separated by scribe lines 222 and 224. Die 220 includes SiN photonics devices 226a, 226b, 226c, 226d, and 226e. Scribe lines 222 and 224 include SiN photonics devices 226f. Die 220, scribe lines 222 and 224, and SiN photonics devices 226a, 226b, 226c, 226d. 226e, and 226f in FIG. 8 generally correspond to die 120, scribe lines 122 and 124, and SiN photonics devices 126a, 126b, 126c, 126d, 126e, and 126f, respectively, in FIG. 3, and may have any implementations described above.

As also shown in FIG. 8, die 220 includes SiN stress-reduction configurations 250e, 250f, 250g, 250h, 250i, and 250j, SiN stress-reduction configurations 252a and 252b, and SiN stress-reduction configuration 254a situated therein. Scribe lines 222 and 224 include SiN stress-reduction configurations 252c and 252d and SiN stress-reduction configuration 254b situated therein. Except for differences noted below, these SiN stress-reduction configurations in FIG. 8 generally correspond to SiN stress-reduction configurations 250 in FIG. 7, and may have any implementations and advantages described above.

SiN stress-reduction configurations 250, 252, and 254 in FIG. 8 substantially surround SiN photonics devices 226 as well as areas corresponding to reserved areas 128 in FIG. 3. Specifically, SiN stress-reduction configurations 250h, 252a, and 254a substantially surround SiN photonics device 226a. SiN stress-reduction configurations 250e and 252a substantially surround SiN photonics device 226b. SiN stress-reduction configurations 250g and 252a substantially surround SiN photonics device 226c. SiN stress-reduction configurations 252a and 252b substantially surround SiN photonics device 226d. SiN stress-reduction configurations 250j and 252a substantially surround SiN photonics device 226e. SiN stress-reduction configurations 252a, 252d, and 254b substantially surround SiN photonics devices 226f.

SiN stress-reduction configurations 250e, 250f, and 252a substantially surround reserved area 128a (shown in FIG. 3). SiN stress-reduction configuration 250g substantially surrounds reserved area 128b (shown in FIG. 3). SiN stress-reduction configurations 250g and 252a substantially surround reserved area 128c (shown in FIG. 3). SiN stress-reduction configurations 250i and 252a substantially surround reserved area 128d (shown in FIG. 3). SiN stress-reduction configurations 250i, 250j, and 252a substantially surround reserved area 128e (shown in FIG. 3). SiN stress-reduction configuration 254a substantially surrounds reserved area 128f (shown in FIG. 3). SiN stress-reduction configurations 252a, 252c, and 254b substantially surround reserved area 128g (shown in FIG. 3). SiN stress-reduction configurations 252a, 252c, and 252d substantially surround reserved area 128h (shown in FIG. 3).

As shown in FIG. 8, SiN stress-reduction configurations 250, 252, and 254 occupy most of the surface area of the topside of the stress-reduced silicon photonics semiconductor wafer, excepting areas corresponding to SiN photonics devices 226 and reserved areas 128 in FIG. 3. SiN stress-reduction configurations 250, 252, and 254 in FIG. 8 are relatively wide compared to SiN photonics devices 226. Notably, in contrast to silicon photonics semiconductor wafer 100 in FIG. 3, large portions of the surface area of the topside of the stress-reduced silicon photonics semiconductor wafer in FIG. 8 are occupied by SiN material. In one implementation. SiN stress-reduction configurations 250, 252, and 254 occupy more than half of the surface area of the topside of the stress-reduced silicon photonics semiconductor wafer.

In the present implementation, SiN stress-reduction configurations 250, 252, and 254 each comprise a periodic pattern of SiN regions 260, 262, and 264, respectively, situated on the topside of the stress-reduced silicon photonics semiconductor wafer, as shown by the enlarged plan views in FIG. 8. In the present implementation, SiN regions 260, 262, and 264 are rectangular-shaped or square-shaped. SiN stress-reduction configuration 250 in the enlarged plan view generally corresponds to any of SiN stress-reduction configurations 250e, 250f, 250g, 250h, 250i, and 250j. Likewise, SiN stress-reduction configuration 252 in the enlarged plan view generally corresponds to any of SiN stress-reduction configurations 252a, 252b, 252c, and 252d in the enlarged plan view SiN stress-reduction configurations 250, 252, and 254 represent patterns with various sizes and/or spacing of SiN regions 260, 262, and 264 (i.e., various pattern density of SiN regions 260, 262, and 264). For example, each SiN region 260 in SiN stress-reduction configurations 250 may be square-shaped and have a width and a length of approximately three microns (3.0 μm), each SiN region 262 in SiN stress-reduction configurations 252 may be square-shaped and have a width and a length of approximately two microns (2.0 μm), and each SiN region 264 in SiN stress-reduction configurations 254 may be square-shaped and have a width and a length of approximately one micron (1.0 μm). SiN regions 260, 262, and 264 may have a relatively small spacings therebetween. In one implementation, the spacing between SiN regions 264 in SiN stress-reduction configuration 254 is a minimum process dimension. In another implementation, the spacing may be based on gap fill ability of an encapsulating layer subsequently formed of the topside of the stress-reduced silicon photonics semiconductor wafer.

The sizes and/or spacing of SiN regions 260, 262, and 264 may scale to correspond with the dimensions of areas SiN stress-reduction configurations 250, 252, and 254 occupy. Patterns with larger sizes of SiN regions may be utilized to occupy areas with larger dimensions, and patterns with smaller sizes of SiN regions may be utilized to occupy areas with smaller dimensions. For example, as shown in FIG. 8. SiN stress-reduction configurations 250 having SiN regions 260 occupy areas with larger dimensions in die 220. Meanwhile, SiN stress-reduction configurations 252 having SiN regions 262 are situated in areas with smaller dimensions, such as between SiN stress-reduction configurations 250 in die 220 and in scribe lines 222 and 224. SiN stress-reduction configurations 254 having SiN regions 264 are situated in areas with even smaller dimensions, such as the narrow spaces in scribe lines 222 and 224.

SiN stress-reduction configurations 254 having smaller SiN regions 264 also occupy contoured areas more effectively. For example, SiN stress-reduction configuration 254a having smaller SiN regions 264 occupies the contoured areas around reserved area 128f (shown in FIG. 3) more effectively. If a SiN stress-reduction configuration 250 having SiN regions 260 were utilized instead of SiN stress-reduction configuration 254a, less of the contoured area around reserved area 128f (shown in FIG. 3) would be occupied by SiN material. The sizes and/or spacing of SiN regions 260, 262, and 264 also influence how much stress SiN stress-reduction configurations 250, 252, and 254 can manipulate. In particular, patterns with greater density of SiN material per square area generally contribute greater stresses.

In various implementations, SiN stress-reduction configurations 250, 252, and/or 254 may have different patterns and/or geometries of SiN regions 260, 262, and/or 264 than shown in FIG. 8. For example, SiN stress-reduction configurations 252 and 254 may employ staggered SiN regions, similar to the staggered SiN regions 260 shown in the enlarged plan view of SiN stress-reduction configuration 250. As another example, SiN regions 260, 262, and/or 264 may be rotated to have a different orientation other than parallel to scribe lines 22 and 224. As yet another example. SiN regions 260, 262, and/or 264 may be circular-shaped or have any other shape. In one implementation, SiN stress-reduction configurations 250, 252, and/or 254 may be solid SiN material, rather than comprise a periodic pattern.

In the present implementation, SiN stress-reduction configurations 250, 252, and 254 are situated either completely within die 220 or completely within scribe lines 222 and 224. However, in other implementations, SiN stress-reduction configurations 250, 252, and/or 254 may be situated partially within die 220 and partially within scribe line 222 or 224. For example, SiN stress-reduction configurations 252a and 252d may be merged and continuous, such that a SiN stress-reduction configuration straddles over the boundaries between die 220 and scribe lines 222 and 224. Notably, as described above, large portions of the surface area of the topside of the stress-reduced silicon photonics semiconductor wafer in FIG. 8 are occupied by SiN material.

Figure 9:
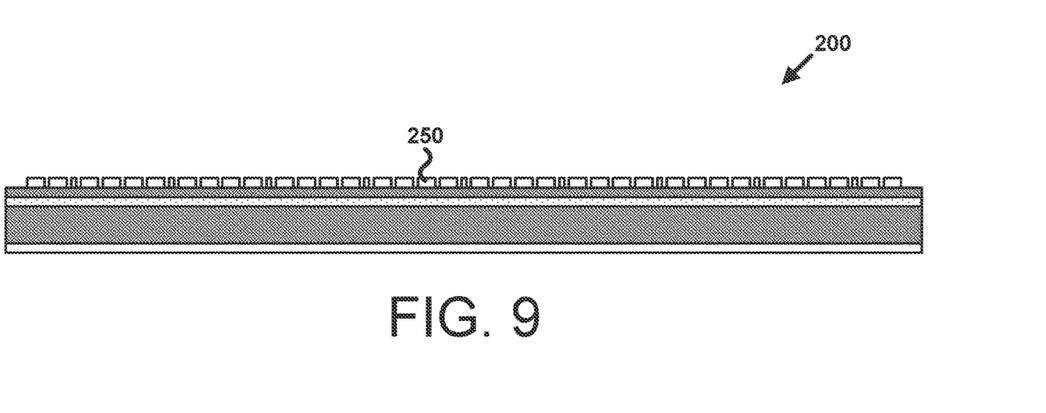
FIG. 9 illustrates an exemplary cross-sectional view of a stress-reduced silicon photonics semiconductor wafer according to one implementation of the present application.

FIG. 9 illustrates an exemplary cross-sectional view of a stress-reduced silicon photonics semiconductor wafer according to one implementation of the present application. Stress-reduced silicon photonics semiconductor wafer 200 in FIG. 9 generally corresponds to stress-reduced silicon photonics semiconductor wafer 200 in FIGS. 7 and 8, and may have any implementations and advantages described above. As shown in FIG. 9, SiN stress-reduction configurations 250 on the topside of stress-reduced silicon photonics semiconductor 200 occupy large portions of the surface area of the topside of the stress-reduced silicon photonics semiconductor wafer 200. Accordingly, stress-reduced silicon photonics semiconductor 200 experiences little to no wafer warp $\Delta H_W$, and is substantially straight.

Although not shown in FIG. 9, additional processing may be performed on stress-reduced silicon photonics semiconductor wafer 200 in accordance with action 238 in the flowchart of FIG. 4. For example, stress-reduced silicon photonics semiconductor wafer 200 may be encapsulated by a dielectric layer. Silicon photonics devices 214 and 216 (shown in FIG. 5) or other devices may be implanted with dopants. Epitaxial layers, such as silicon germanium (SiGe) epitaxial layers for photodiodes, may be formed over stress-reduced silicon photonics semiconductor wafer 200. A back end of line (BEOL) including metallizations and interlayer dielectrics may also be formed over stress-reduced silicon photonics semiconductor wafer 200. Dies 220 (shown in FIG. 8) may separated by dicing through scribe lines 222 and 224.

Figure 10:
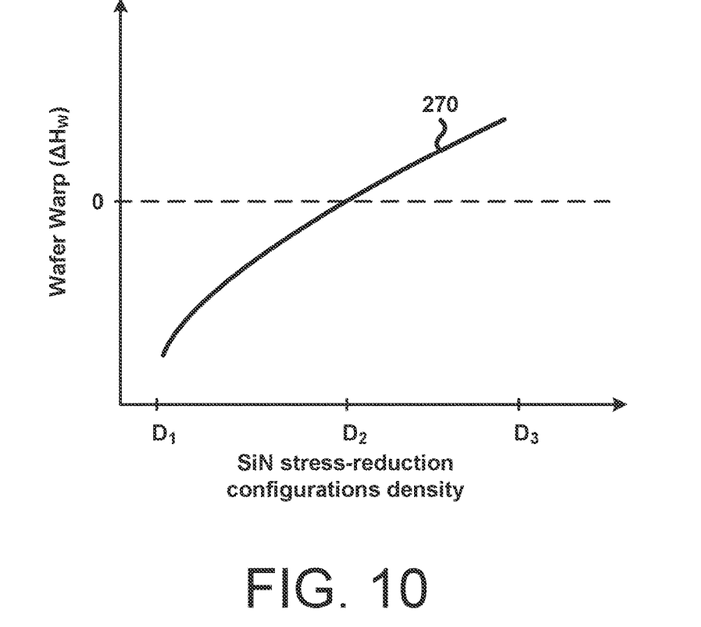
FIG. 10 illustrates an exemplary graph of wafer warp versus silicon nitride stress-reduction configurations density according to one implementation of the present application.

FIG. 10 illustrates an exemplary graph of wafer warp versus silicon nitride stress-reduction configurations density according to one implementation of the present application. In the graph, the y-axis represents the wafer warp $\Delta H_W$ experienced by a stress-reduced silicon photonics semiconductor wafer, such as stress-reduced silicon photonics semiconductor wafer 200 in FIG. 9. The x-axis represents the density of silicon nitride stress-reduction configurations, such as SiN stress-reduction configurations 250, 252, and 254 in FIG. 8 (i.e., the x-axis represents the percentage of the surface area of the topside of the stress-reduced silicon photonics semiconductor wafer that is occupied by SiN material).

The zero line on the y-axis represents zero wafer warp $\Delta H_W$ or a substantially straight wafer. Positive or negative values on the y-axis correspond to the direction of the wafer warp $\Delta H_W$. In particular, negative values correspond to a wafer warping in the direction show in in FIG. 1, where ends are lower than a center, while positive values correspond to a wafer warping opposite the direction show in in FIG. 1, where ends are higher than a center.

As shown by trace 270 in FIG. 10, a first lower SiN stress-reduction configurations density $D_1$ is shown to result in a high magnitude wafer warp $\Delta H_W$ in the negative direction. As SiN stress-reduction configurations density increases toward second SiN stress-reduction configurations density $D_2$, the magnitude of the wafer warp $\Delta H_W$ in the negative direction generally decreases. At second SiN stress-reduction configurations density $D_2$, there is zero wafer warp $\Delta H_W$. As SiN stress-reduction configurations density increases toward third higher SiN stress-reduction configurations density $D_3$, the magnitude of the wafer warp $\Delta H_W$ in the positive direction generally increases. Third higher SiN stress-reduction configurations density $D_3$ is shown to result in a high magnitude wafer warp $\Delta H_W$ in the positive direction.

As shown by trace 270, appropriate selection of SiN stress-reduction configurations density can reduce the magnitude of, or eliminate wafer warp $\Delta H_W$. SiN stress-reduction configurations density may be adjusted by adjusting the areas or pattern geometries of SiN stress-reduction configurations 250, 252, and 254 in FIG. 8, as described above. As also shown by trace 270 in FIG. 10, the direction of the wafer warp $\Delta H_W$ can be inverted depending on the SiN stress-reduction configurations density. In particular, SiN stress-reduction configurations 250, 252, and 254 in FIG. 8 can cause the conventional negative wafer warp $\Delta H_W$ shown in FIG. 1 to change into a positive wafer warp $\Delta H_W$, which may be desirable for certain applications. For example, positive wafer warp $\Delta H_W$ may counteract stresses introduced by additional processing performed on stress-reduced silicon photonics semiconductor wafer 200 in accordance with action 238 in the flowchart of FIG. 4, such that the processed device remains substantially straight.

Stress-reduced silicon photonics semiconductor wafers and dies according to the present invention, such as stress-reduced silicon photonics semiconductor wafer 200 in FIGS. 7 through 9, result in numerous advantages, some of which are stated below. First, because SiN stress-reduction configurations 250, 252, and 254 are situated on the topside of stress-reduced silicon photonics semiconductor 200, stress-reduced silicon photonics semiconductor 200 may experience little to no wafer warp $\Delta H_W$, as described above. As a result, stress-reduced silicon photonics semiconductor wafer 200 is substantially straight, and subsequent photolithography can be performed on stress-reduced silicon photonics semiconductor wafer 200 with accurate alignment. As a corollary, devices that rely on this photolithography have increased reliability and performance. Basic wafer handling is also improved. For example, stress-reduced silicon photonics semiconductor wafer 200 can be secured using a vacuum chuck. As another example, handling equipment relying on a certain wafer height will not collide stress-reduced silicon photonics semiconductor wafer 200 into other equipment or into other wafers, thereby avoiding equipment damage and increasing yield.

Second, SiN stress-reduction configurations 250, 252, and 254 can be formed on larger wafers without additional complexity. Accordingly, the advantages above are compounded for larger wafers, where wafer warp $\Delta H_W$ would otherwise be a more significant concern for conventional larger wafers.

Third, stress-reduced silicon photonics semiconductor wafer 200 can reduce or eliminate wafer warp $\Delta H_W$ without eliminating SiN photonics devices (such as SiN photonics device 206 in FIG. 7 or SiN photonics devices 226 in FIG. 8) or the SiN layers 204 and 240 (shown in FIG. 6) typically utilized to form SiN photonics devices at large scales. Accordingly, stress-reduced silicon photonics semiconductor wafer 200 can both reduce or eliminate wafer warp $\Delta H_W$ and capitalize on the optical advantages of integrated SiN photonics devices, such as different index of refraction and lower optical propagation losses, especially at commonly used wavelengths.

Fourth, since SiN stress-reduction configurations 250, 252, and 254 and SiN photonics devices 206 and 226 can be formed substantially concurrently, stress-reduced silicon photonics semiconductor wafer 200 does not require additional masking or etching actions in the fabrication process.

Fifth, stress-reduced silicon photonics semiconductor wafer 200 can be formed from a typical pre-fabricated SOI wafer such as the SOI wafer shown in FIG. 5. Accordingly, stress-reduced silicon photonics semiconductor wafer 200 is suitable for large scale production without premium costs associated with specialty substrates.

Sixth, wafer warp $\Delta H_W$ can be easily tuned to a desired magnitude as well as a desired direction by adjusting SiN stress-reduction configurations 250, 252, and 254, as described above. Accordingly, stress-reduced silicon photonics semiconductor wafer 200 may be suitable for a wide range of applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A stress-reduced silicon photonics semiconductor wafer comprising:
   a silicon nitride layer on a backside of said wafer;
   at least one silicon nitride stress-reduction configuration on a topside of said wafer and occupying only a portion of said topside;
   at least one silicon nitride photonics device on said topside of said wafer.

2. The semiconductor wafer of claim 1, wherein said silicon photonics semiconductor wafer is a silicon-on-insulator (SOI) wafer having a top silicon layer, and wherein said at least one silicon nitride stress-reduction configuration is situated over said top silicon layer.

3. The semiconductor wafer of claim 1, wherein said at least one silicon nitride stress-reduction configuration does not occupy areas corresponding to said at least one silicon nitride photonics device.

4. The semiconductor wafer of claim 1, wherein said at least one silicon nitride stress-reduction configuration occupies more than half of a surface area of said topside of said wafer.

5. The semiconductor wafer of claim 1, wherein said at least one silicon nitride stress-reduction configuration comprises a pattern of rectangular-shaped or square-shaped silicon nitride regions on said topside of said wafer.

6. The semiconductor wafer of claim 1, wherein said at least one silicon nitride stress-reduction configuration is situated at least partially in a scribe line of said wafer.

7. The semiconductor wafer of claim 1, wherein said at least one silicon nitride stress-reduction configuration is situated at least partially in a die of said wafer.

8. The semiconductor wafer of claim 1, wherein said at least one silicon nitride photonics device is selected from the group consisting of a silicon nitride waveguide, and a silicon nitride resonator.

9. A method for making a stress-reduced silicon photonics semiconductor wafer, said method comprising:
   forming a silicon nitride layer on a backside of said wafer;
   forming at least one silicon nitride stress-reduction configuration on a topside of said wafer and occupying only a portion of said topside;
   forming at least one silicon nitride photonics device on said topside of said wafer.

10. The method of claim 9, wherein said forming said at least one silicon nitride stress-reduction configuration is performed concurrently with said forming said at least one silicon nitride photonics device.

11. The method of claim 9, wherein said silicon photonics semiconductor wafer is a silicon-on-insulator (SOI) wafer having a top silicon layer, and wherein said at least one silicon nitride stress-reduction configuration is situated over said top silicon layer.

12. The method of claim 9, wherein said at least one silicon nitride stress-reduction configuration does not occupy areas corresponding to said at least one silicon nitride photonics device.

13. The method of claim 9, wherein said at least one silicon nitride stress-reduction configuration occupies more than half of a surface area of said topside of said wafer.

14. The method of claim 9, wherein said at least one silicon nitride stress-reduction configuration comprises a pattern of rectangular-shaped or square-shaped silicon nitride regions on said topside of said wafer.

15. The method of claim 9, wherein said at least one silicon nitride stress-reduction configuration is situated at least partially in a scribe line of said wafer.

16. A stress-reduced silicon photonics semiconductor die comprising:
   a silicon nitride layer on a backside of said die;
   a silicon nitride stress-reduction configuration on a topside of said die and occupying only a portion of said topside;
   a silicon nitride photonics device on said topside of said die;
   a silicon photonics device in said die.

17. The semiconductor die of claim 16, wherein said silicon photonics semiconductor die is a silicon-on-insulator (SOI) die having a top silicon layer, and wherein said at least one silicon nitride stress-reduction configuration is situated over said top silicon layer.

18. The semiconductor die of claim 16, wherein said silicon nitride stress-reduction configuration does not occupy areas corresponding to said silicon nitride photonics device.

19. The semiconductor die of claim 16, wherein said at least one silicon nitride stress-reduction configuration comprises a pattern of rectangular-shaped or square-shaped silicon nitride regions on said topside of said die.

20. The semiconductor die of claim 16, wherein said at least one silicon nitride photonics device is selected from the group consisting of a silicon nitride waveguide, and a silicon nitride resonator.

* * * * *